AMPLITUDE LIMITER FOR A.C. SIGNALS USING A TUNNEL DIODE

Filed Dec. 18, 1959

INVENTOR.
Gerald E. Theriault
BY
ATTORNEY 3,092,734
Patented June 4, 1963

3,092,734

AMPLITUDE LIMITER FOR A.C. SIGNALS USING A TUNNEL DIODE

Gerald E. Theriault, Haddon Heights, N.J., assignor to Radio Corporation of America, a corporation of Delaware Filed Dec. 18, 1959, Ser. No. 860,387
2 Claims. (Cl. 307—88.5)

This invention relates generally to improved methods of and means for signal limiting, and particularly to improved methods of and means for utilizing negative conductance semiconductor diodes for signal limiting.

An early form of such negative conductance diodes is described by Leo Esaki in Physical Review, vol. 109, page 603 (1958).

A particular form of such a negative conductance diode especially useful with the instant invention is known as a tunnel diode. Such tunnel diodes are semiconductor devices employing a very thin, or abrupt, p-n junction, the transition region from p-type conductivity to n-type conductivity preferably being less than 200 A. In preferred types of tunnel diodes, the semiconductor has a moderate band-gap and both sides of the p-n junction are doped (i.e. contain conductivity-type-determining impurities) almost to the point where the semiconductor becomes polycrystalline, in order to provide a very high concentration of free charge carriers. Such diodes conduct current in the forward direction by two processes: at low voltages conduction is principally by quantum mechanical tunneling of charge carriers through the depletion region of the p-n junction. Such current due to tunneling rises rapidly to a maximum and then falls to zero over a short range of forward bias voltage, generally less than 1 volt, and thus provides the negative conductance characteristic. At higher voltages the current is due to charge carriers passing over the barrier of the p-n junction.

Thus a tunnel diode exhibits a positive resistance characteristic for very small forward bias voltages, a negative resistance characteristic for intermediate values of forward bias voltages, and a positive resistance for higher values of forward bias voltages. Stated in another manner, as the forward voltage applied to a voltage controlled negative resistance diode is continuously increased from zero, the diode current first increases to a relatively sharp maximum value, then decreases to a relatively deep and broad minimum, and thereafter again increases. For presently known types of negative resistance germanium diodes, an exemplary voltage range over which the diode exhibits a negative resistance characteristic is from 50 to 350 millivolts (mv.). The negative resistance of the diode, which is the reciprocal negative slope of its current-voltage characteristic, depends on the construction of the diode.

An object of the invention is to provide improved methods of and means for utilizing negative conductance semiconductor diodes including tunnel diodes for limiting the amplitudes of signals applied thereto.

An additional object is to provide improved methods of and means for limiting the amplitudes of signals in a tunnel diode circuit.

A further object is to provide improved methods of and means for biasing a tunnel diode to limit the amplitudes of signals applied to said diode.

The foregoing objects and advantages are accomplished in accordance with a preferred embodiment of the invention by applying a forward bias potential from a suitable source to a negative conductance diode, such as a tunnel diode, preferably so that the load line of the biasing source intersects the current-voltage characteristic of the diode in each of the two positive conductance regions thereof near the current maximum and minimum respectively.

The resistance of the biasing voltage circuit is selected to provide said multiple intersections with the diode characteristic. The diode preferably is loaded sufficiently to prevent self-oscillation. Alternating signals, or pulsed signals of one polarity, applied to the diode drive the diode from one positive conductance region through its negative conductance region to a point just within its other or next adjacent positive conductance region. The points selected should be the relatively high positive resistance values close to the transitions to negative resistance values. Reversal of applied signal reverses the diode operation to return from the other positive conductance region through the negative conductance region to the original operating point near the peak of the initial positive conductance region. The diode is connected in shunt with the signal circuits. Limiting occurs when the applied excess signal rapidly drives the diode to lower positive resistance values on either side of its negative resistance region. Since the diode is connected in shunt with the signal circuit, the excursion into the lower resistance values causes heavy loading of the signal circuits with resultant signal limiting.

If desired for some applications, the loading on the diode may be selected, and/or the effective bias source resistance may be adjusted, to permit controlled oscillation to lock-in with applied signals.

The invention will be described in greater detail by reference to the accompanying drawing wherein similar reference characters are applied to similar elements, and wherein.

A diode which could be used in practicing the invention includes a single crystal of $10^{-3}$ ohm-cm. n-type germanium which is doped with arsenic to have a donor atomic concentration of $4.0 \times 10^{19}$ cm.$^{-3}$, with a rectifying junction formed by alloying thereto a minute dot of 99% idium, .5% gallium, and .5% zinc by weight, by methods known in the semiconductor art, which may be accomplished, for example, as described by H. S. Sommers, Jr. in Proceedings of the I.R.E., volume 47, No. 7, July 1959, at pages 1201 to 1206 inclusive.

A semiconductor device, prepared according to the above example, exhibits the following characteristics:

$\overline{R}$=8.5 ohm (Ω)
$C$=270 micromicrofarads (μμf.)
$\overline{R}C$=2.295 millimicroseconds (mμs.)

Where $\overline{R}$ is the value of the negative resistance at the inflection point between current maximum and current minimum; C is the capacitance of the junction at the operating point of the diode; and $\overline{R}C$ is the approximate time constant determining the frequency characteristic of the diode.

Other semiconductors may be used instead of germanium, particularly silicon and the III-V compounds. A III-V compound is a compound composed of an element from each of group III and group V of the periodic table of chemical elements, such as gallium arsenide, indium arsenide and indium antimonide. Where III-V compounds are used, the p and n type impurities ordinarily used in those compounds are also used to form the diode described. Thus, sulfur is a suitable n-type impurity and zinc a suitable p-type impurity which is also suitable for alloying.

Figure 3:
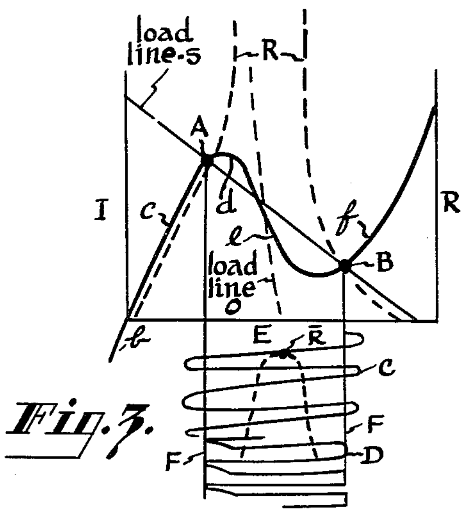
FIGURE 3 is a graph illustrative of the operational characteristics of the circuits of FIGURES 1 and 2.

The current-voltage characteristic of a typical diode suitable for use with circuits embodying the invention is shown in the solid line curve in FIGURE 3. The current scales depend on area and doping of the junction, but representative currents are in the milliampere range.

For a small voltage in the back direction, the back current of the diode increases as a function of voltage as is indicated by the region *b* of FIGURE 3.

For small forward bias voltages, the characteristic is nearly symmetrical (FIGURE 3, region *c*). The initial forward current is due to quantum mechanical tunneling. At higher forward bias voltages, the forward current due to tunneling reaches a maximum (region *d*, FIGURE 3), and then begins to decrease. This drop continues (FIGURE 3, region *e*) until eventually normal injection over the barrier becomes important and the characteristic turns into the usual forward behavior, (region *f*, FIGURE 3). The selected load line S of the power supply is shown intersecting the diode characteristic at the points A and B. The dashed line curves R and $\overline{R}$ are illustrative respectively of the variations of positive resistance and negative resistance of the diode.

The negative resistance of the diode is the incremental change in voltage divided by the incremental change in current, or the reciprocal slope of the region *e* of FIGURE 3. To bias the diode for stable operation in the negative conductance region of its characteristic requires a suitable voltage source having a smaller internal impedance than the negative resistance of the diode. Such a bias source load line is shown by the dash line O. However, for stable operation in either of the positive conductance regions the voltage source should have a higher internal impedance than the negative resistance of the diode.

Figure 1:
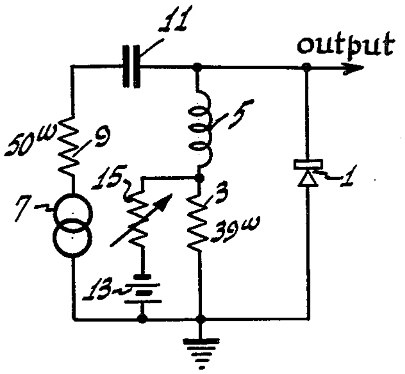
FIGURE 1 is a schematic circuit diagram of a preferred embodiment of the invention.

Referring to FIG. 1, a preferred embodiment of the invention includes a negative conductance semiconductor diode 1, such as a tunnel diode, shunted by the series combination of a 39 ohm resistor 3 and an inductance 5 of about 100 microhenries for an operating frequency of about 1 megacycle.

A multiple intersection between the load line of the bias source and the points A and B of the diode characteristic occurs since the effective bias source resistance exceeds the value of the diode negative resistance.

The input signal source 7 to be limited having a source resistance 9 of about 50 ohms is preferably coupled to the diode through a coupling capacitor 11.

The diode is biased in the forward direction, for example by about 50 millivolts, to one of the stable points A or B, close to the current maximum or minimum respectively, of the positive conductance portions of its operating characteristic, by a battery 13 coupled, through an adjustable series isolating resistor 15 of about 300 ohms, to the junction of the resistor 3 and inductance 5. Limited output signals are derived across the diode.

Figure 2:
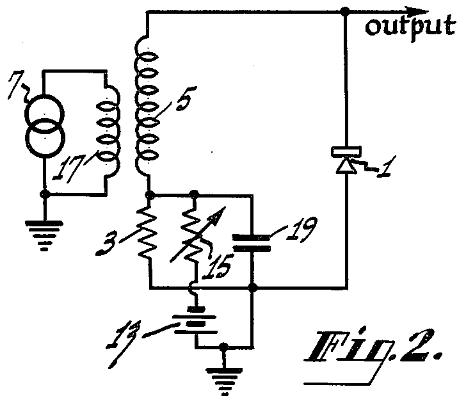
FIGURE 2 is a schematic circuit diagram of a modification of the circuit of FIGURE 1.

The circuit of FIG. 2 is similar to the circuit of FIG. 1 except that the input signal source 7 is coupled inductively through a winding 17 to the inductance 5, instead of being coupled to the diode through a series capacitor.

Referring to FIG. 3, the operation of the circuits of FIGS. 1 and 2 is as follows: the diode 1 is initially biased, in the absence of input signals, to the point A or B, for example near the current peak of the initial positive conductance portion of its operating characteristic. When input signals represented by the waveform C are applied to the limiter circuit, the diode rapidly passes through the negative conductance region *e* to the second stable condition B at the lower portion of the next adjacent positive conductance region *f*. When the signal reverses the diode again rapidly passes through the negative conductance region *e* from the stable point B to the stable point A. The diode offers a relatively high shunt resistance to the signal circuit at both points A and B. However, the shunt resistance drops very rapidly for signal voltage values lower than A and higher than B. Accordingly, signal values which tend to drive the diode beyond these limits will be effectively limited. Since the diode circuit will continue to alternate between the stable points A and B, the output signals D derived therefrom will be limited substantially to the values F—F over relatively wide limits of input source signal amplitudes. For example, a typical circuit as described heretofore will provide substantially constant amplitude square wave output signals when excited by reasonable level input signals over a frequency range of 0.3 to 4.0 megacycles. For input signals over the range of 0.25 to 5.0 volts peak-to-peak, the output signals are limited to the range of 0.25 to 0.35 volt peak-to-peak.

The use of the inductor 5 is helpful to increase circuit sensitivity for low amplitude input signals, althrough the circuit is operable over a wider input frequency range if the inductor 5 is reduced in inductance or eliminated from the circuit. If signal sensitivity is an important consideration, controlled oscillation in response to input signals may be provided by reducing the loading provided by the resistor 3.

The circuits described provide, for example, satisfactory signal limiting between I-F stages or between the output of the I-F amplifier and the F-M detector of an F-M receiver.

Figure 4:
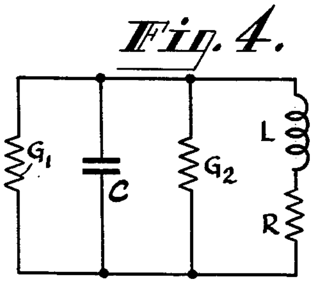
FIGURE 4 is a schematic circuit diagram illustrative of the loading effects on oscillatory circuits employing tunnel diodes.

Loading effects on tunnel diode circuits can be explained by reference to the equivalent circuit shown in FIG. 4 wherein the effective conductance G of the circuit is equal to $G_2 - G_1$ where $G_1$ is the conductance of the diode and $G_2$ is the positive conductance in shunt with the diode.

For oscillations to exist $$\frac{R}{2L} < \frac{G}{2C} \qquad (1)$$

For relaxation oscillation $$R\sqrt{\frac{L}{C}} + \frac{G}{\sqrt{\frac{L}{C}}} > 2 \qquad (2)$$

For sine wave oscillation $$R\sqrt{\frac{L}{C}} + \frac{G}{\sqrt{\frac{L}{C}}} < 2 \qquad (3)$$

The above equations define the conditions for oscillation generally. Such a condition assumes that the bias potential is applied to the diode from a bias source having an impedance sufficiently low so that the diode can be biased in its negative resistance region. The point of intersection of the bias source load line O on the negative resistance portion *e* of the diode characteristic determines the waveform of the oscillations. If the D.C. bias source is such that the source resistance is higher than the negative resistance of the diode, the circuit will not oscillate, but only will switch from one positive resistance region to the other positive resistance region. Weak controlled oscillation improves signal limiting under some conditions. To provide such oscillations, the bias source effective resistance preferably should be much lower than, such as one-tenth, the minimum negative resistance of the diode. It is also preferable that the inductive reactance in the diode circuit be relatively high compared to the minimum negative resistance of the diode. A bypass capacitor 19 may be connected across the resistor 3 if desired.

Figure 5:
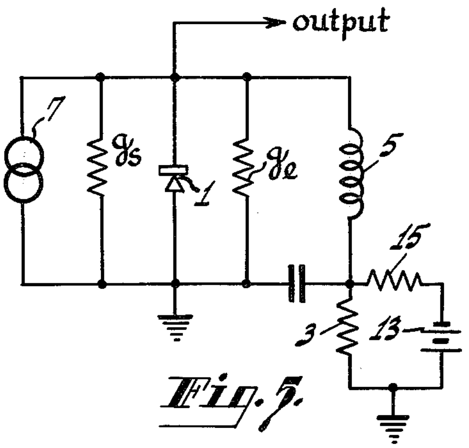
FIGURE 5 is a schematic circuit diagram of a typical limiter circuit according to the invention which is useful as an F-M amplifier.

FIGURE 5 is illustrative of a typical tunnel diode amplifier circuit suitable for amplifying and limiting frequency modulated signals. The circuit will be particularly useful as the first intermediate frequency amplifier in a frequency modulation receiver. The loading provided by the signal source 7 and the output circuit are represented respectively by the conductances $g_s$ and $g_l$. The bias voltage applied to the diode and the bias source load line intersection with the negative resistance portion of the diode characteristic are selected so that the circuit is a weak oscillator. Thus the oscillator will track or follow frequency deviations of the input signal as described heretofore. However, amplitude modulation of the input signal will be operative effectively as exhalted carrier so that its percentage modulation will be decreased. Thus the presence of noise signals will be reduced in modulation percentage. Furthermore, the frequency modulation gain will be limited as the oscillator has a relatively broad range of substantially constant amplitude output at low input levels. Output signals derived from the circuit may be employed to drive a succeeding intermediate frequency amplifier.

Figure 6:
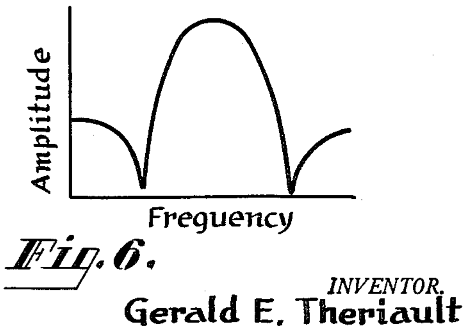
FIGURE 6 is a graph illustrative of the frequency response characteristics of a typical embodiment of the circuit of FIGURE 5.

FIGURE 6 is illustrative of the transmission characteristic of the limiter as a function of input frequency, showing amplitude of output as the ordinator and input frequency as the abscissal.

What is claimed is:

1. A signal limiting circuit comprising a voltage controlled semiconductor tunnel diode having an operating characteristic with two positive conductance portions separated by a negative conductance portion, means for biasing said diode to operate at a selected stable point on one of said positive conductance portions in the absence of applied signals, means for loading said diode to control oscillation when signals are applied thereto, means for applying signals to said diode to drive said diode through said negative conductance portion to a second stable point on the other of said positive conductance portions of said operating characteristic, whereby signals having peak-to-peak amplitudes greater than the difference between said stable points are clipped to levels substantially determined by said stable points, and an inductor connected in series with said diode for resonating said circuit to a frequency of said applied signals.

2. A signal limiting circuit comprising a voltage controlled semiconductor tunnel diode having an operating characteristic with two positive conductance portions separated by a negative conductance portion, means for biasing said diode to operate at a selected stable point on one of said positive conductance portions in the absence of applied signals, means for loading said diode to control oscillation when signals are applied thereto, and means for applying signals to said diode to drive said diode through said negative conductance portion to a second stable point on the other of said positive conductance portions of said operating characteristic, whereby signals having peak-to-peak amplitudes greater than the difference between said stable points are clipped to levels substantially determined by said stable points, said means for applying signals to said diode being inductively coupled to said inductor.

References Cited in the file of this patent

UNITED STATES PATENTS

| | | |
|---|---|---|
| 2,843,765 | Aigrain | July 15, 1958 |
| 2,975,304 | Price | Mar. 14, 1961 |
| 3,019,981 | Lewin | Feb. 6, 1962 |